United States Patent [19]

Kowshik et al.

[11] Patent Number: 4,873,671
[45] Date of Patent: Oct. 10, 1989

[54] SEQUENTIAL READ ACCESS OF SERIAL MEMORIES WITH A USER DEFINED STARTING ADDRESS

[75] Inventors: Vikram Kowshik, San Jose; Sudhakar Boddu, Sunnyvale; Elroy M. Lucero, San Jose, all of Calif.

[73] Assignee: National Semiconductor Corporation, Santa Clara, Calif.

[21] Appl. No.: 149,399

[22] Filed: Jan. 28, 1988

[51] Int. Cl.$^4$ .......................... G11C 7/00; G11C 8/00
[52] U.S. Cl. .......................... 365/189.12; 365/230.09; 365/78; 377/76
[58] Field of Search ............... 365/230, 189, 239, 236, 365/240, 78, 221; 377/76, 69, 70

[56] References Cited

U.S. PATENT DOCUMENTS

| | | | |
|---|---|---|---|
| 4,138,732 | 2/1979 | Suzuki et al. | 364/900 |
| 4,236,255 | 11/1980 | Jansen et al. | 364/900 |
| 4,422,160 | 12/1983 | Watanabe | 365/189 X |
| 4,507,760 | 3/1985 | Fraser | 365/221 |
| 4,646,270 | 2/1987 | Voss | 3265/221 |
| 4,751,684 | 6/1988 | Holt | 365/189 |

FOREIGN PATENT DOCUMENTS 3634657 4/1987 Fed. Rep. of Germany ........ 365/78
2183374 6/1987 United Kingdom .

Primary Examiner—Stuart N. Hecker
Assistant Examiner—Alfonso Garcia
Attorney, Agent, or Firm—Limbach, Limbach & Sutton

[57] ABSTRACT

Circuitry for serial read memory access utilizing a random starting address is disclosed. Fast read access is provided without upsetting the original data pattern stored in the memory core if the sequential read is terminated in midstream. After the last memory address is reached, the access automatically rolls over to the first address. The circuit provides both random and sequential access functions and allows the memory to be used as a shift register of variable length.

4 Claims, 3 Drawing Sheets

SEQUENTIAL READ ACCESS OF SERIAL MEMORIES WITH A USER DEFINED STARTING ADDRESS

BACKGROUND OF THE INVENTION

1. Field of the Invention

The present invention relates to integrated circuits and, in particular, to circuitry which provides fast read access of serial memories utilizing a random starting address.

2. Description of the Prior Art

U.K. Patent Application GB No. 2 183 374 A is directed to a sequential access memory which provides serial read access, the ability for simultaneous read and write of data, and eliminates the need for complex addressing and refresh circuitry by using the memory as one large shift register.

The memory device disclosed in the above-identified U.K. application includes individual FET memory cells arranged in a matrix with a common set of column bit lines driven by bit line transistors to prepare the cells for read or write. The rows of the matrix are selected by a pointer register, a shift register in which a defined bit condition circulates to select the rows sequentially. The data input is offered to all cells in the first column and the cell outputs and inputs are merged so that the whole device acts as a serial shift register. When a cell is selected for read-out, its neighbor is selected for write-in, the selection using the appropriate gate primed from the shift register. As a result of the merging of inputs and outputs, a bit read from one cell goes to the cell in the next adjacent column and one up from the cell in the signal column. Thus, the data progresses through the memory matrix to the output.

However, the above-described sequential access memory suffers from a number of major disadvantages. First, it does not provide random access capability. Second, the data pattern in the array is altered if the sequential read is terminated in midstream. Third, the memory cannot be used as a shift register of variable lengths. These disadvantages limit the use of this memory device to specific applications.

U.S. Pat. No. 4,422,160 issued to Watanabe on Dec. 20, 1983, discloses a memory device which features serial access in a page-mode type of operation for RAMs and semi-random access capability. Its data pattern is not altered if sequential read is terminated in mid-stream. Fewer pins are required since row and column address information is introduced through the same set of address terminals in synchronism with row address strobe and column address strobe signals, respectively.

As stated above, in the Watanabe memory device, row address information and column address information are incorporated through the same set of address terminals in response to a row address strobe signal and a column address strobe signal, respectively. Furthermore, a shift register, the output of which is adapted to select a column of a memory cell matrix, is provided in addition to a column decoder. The shift operation of the shift register is effected each time the column strobe signal is made active under the active state of the row address strobe signal. The significant feature of the Watanabe memory device resides in the fact that the column address decoder and the column address inverter are made their active states when the column address strobe signal is first made active under the active state of the row strobe signal; these states of the column address inverter and column decoder are maintained irrespective of subsequent change of the column address strobe signal by the time the row strobe signal goes inactive. The shift register and an input/output circuit are repeatedly made active in synchronism with changes in the level of the column strobe signals between its active and inactive states under the active state of the row address strobe signal. Thus, in the operation of the Watanabe device, the shift operation in the shift register and activation of the input/output circuit can be repeatedly performed at a high speed and with low power consumption without repeating the active and inactive state of the column address inverter buffer and the column decoder.

However, the Watanabe memory device also suffers from several disadvantages. First, it does not provide a fully random access capability because a new row address must be provided after all the columns along a particular row have been read out. Second, the Watanabe device cannot be used as a shift register of variable lengths. Therefore, like the device described in the above-identified UK application, the Watanabe memory device is also limited to use in specific applications.

SUMMARY OF THE INVENTION

The present invention provides circuitry for serial read memory access with a random starting address. Fast read access is provided without upsetting the original data pattern stored in the memory core if the sequential read is terminated in midstream. After the last memory address is reached, the access automatically rolls over to the first address. Both random and sequential access are provided and the memory can be used as a shift register of variable lengths, making it more generally applicable.

An embodiment of circuitry for sequential read access of a serial memory array in accordance with the present invention comprises an address latch which stores an address used to access the memory array to read data from a corresponding data register in the array. The address latch includes a counter which increments the stored address upon receipt of an address increment signal. The data bits from the accessed memory register are serially shifted to an output pad by a data shift register which receives the parallel output of the array. A data stream counter keeps track of the number of bits output on the data out pin, issues the increment address signal to the address latch at a fixed count during the read sequence and zeroes itself after a word of data is output on the data out pin. In this way, the address stored in the address latch is sequentially incremented such that each of the data registers in the array is read out serially.

Other features and advantages of the present invention will be understood and appreciated by reviewing the description of the invention provided below which should be considered in conjunction with the accompanying drawings.

DESCRIPTION OF THE INVENTION

Figure 1:
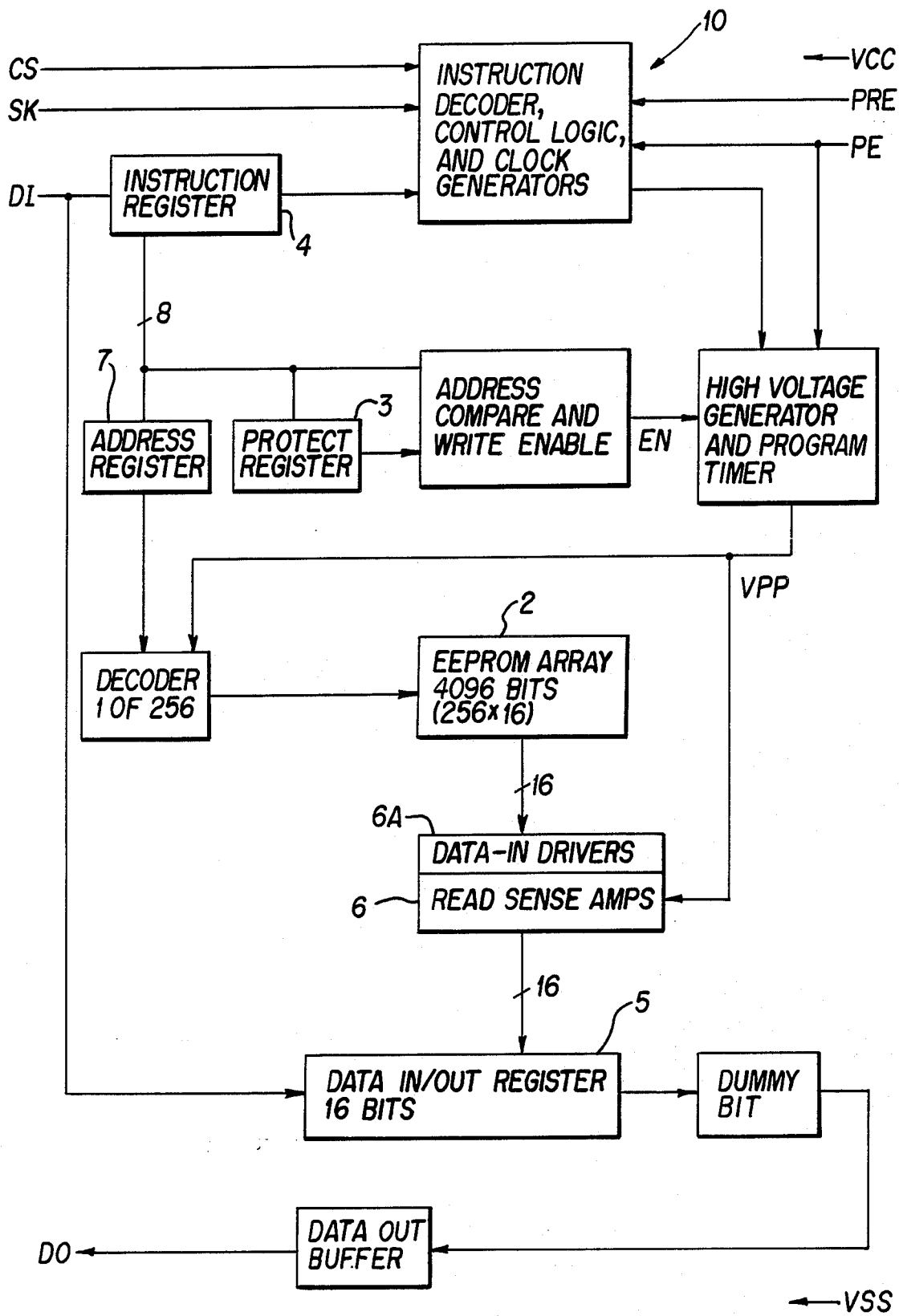
FIG. 1 is a schematic block diagram illustrating a serial read access circuit in accordance with the present invention.

FIG. 1 shows the basic elements of an electrically erasable programmable read only memory (EEPROM) device. The device includes an EEPROM array 2 which is divided into 256 storage registers of 16 bits each. N registers in the array can be protected against data modification by programming into a special on-chip memory protect register 3 the address of the first register in the array 2 to be protected. Thereafter, all attempts to alter data in the storage register whose data address is equal to or greater than the address stored in the memory protect register 3 will be ignored. This data protection technique is more fully described in copending and commonly assigned U.S. Pat. Application Serial No. 149,373, titled PROGRAMMABLE MEMORY DATA PROTECTION SCHEME, filed of even data herewith by Boddu et al, which application is hereby incorporated by reference.

As shown generally in FIG. 1, and described in greater detail below, data is written into a selected storage register within EEPROM array 2 by serially clocking a WRITE instruction into instruction register 4 and then clocking 16 bits of data to be written into the address specified in the WRITE instruction into data shift register 5. After the 16 bits of data have been clocked into data shift register 5, this data is transferred in parallel to the specified storage register in array 2 via data-in drivers 6A in a single, self-timed WRITE cycle.

A READ instruction loads the address of the memory register to be read from the instruction register 4 into an 8-bit address register 7. The data from the accessed storage register is then transferred in parallel to data shift register 5 via the sense amplifiers 6 and then clocked out serially to the Data-Out pin DO.

Figure 2:
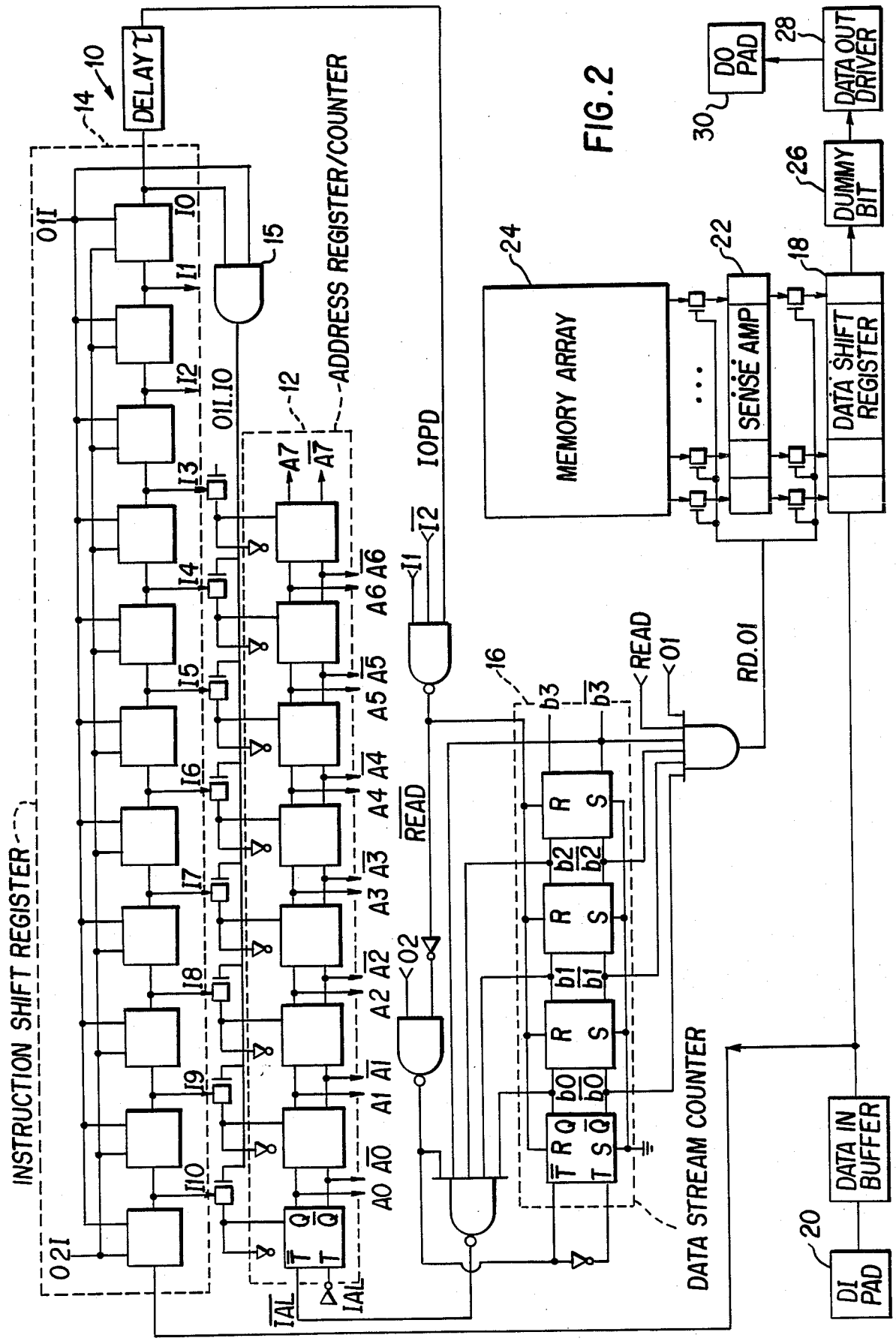
FIG. 2 is a timing diagram associated with the serial read access circuit shown in FIG. 1.

FIG. 2 shows serial read access circuitry 10 for sequentially reading storage registers within array 2 in accordance with the present invention. The circuit 10 comprises two primary components: an address register/counter 12 and a data stream counter 16.

The address register/counter 12 latches the starting address input from the instruction shift register 14 during $\phi$1I.Io high. That is, when the start bit of the instruction which is being serially shifted into instruction shift register 14 migrates over a series of clock cycles to register location IO, the output $\phi$1I.Io of AND gate 15 goes high, causing the parallel transfer of the starting address from the instruction shift register 14 to the address register/counter 12. As will be described in greater detail below, the address register/counter 12 has the ability to count up in increments of 1 in response to IAL pulse inputs to the address latch 12.

A data stream counter 16 monitors the number of clock pulses during the READ mode and generates an increment address latch (IAL) signal at a fixed count. The data stream counter 16 also generates a signal RD.$\phi$1, during which time a new register in memory array 24 corresponding to the new incremented address in address register/counter 12 is read by the sense amplifiers 22. The new data is transferred into the masters and slaves of the data shift registers 18 while the old data bit DO is clocked out of the dummy bit 26.

The data shift registers 18 are loaded either serially from the data-in (DI) pin 20 (as described above in conjunction with a WRITE instruction) or can be loaded in parallel during the RD.$\phi$1 phase from the sense amplifiers 22. As stated above, the data loaded serially into the data shift register 18 is written into the memory array 24 in parallel. The data loaded in parallel to the shift registers 18 during a read access is serially clocked out via dummy bit 26 and data output drivers 28 onto the data output (DO) pad 30.

Figure 3:
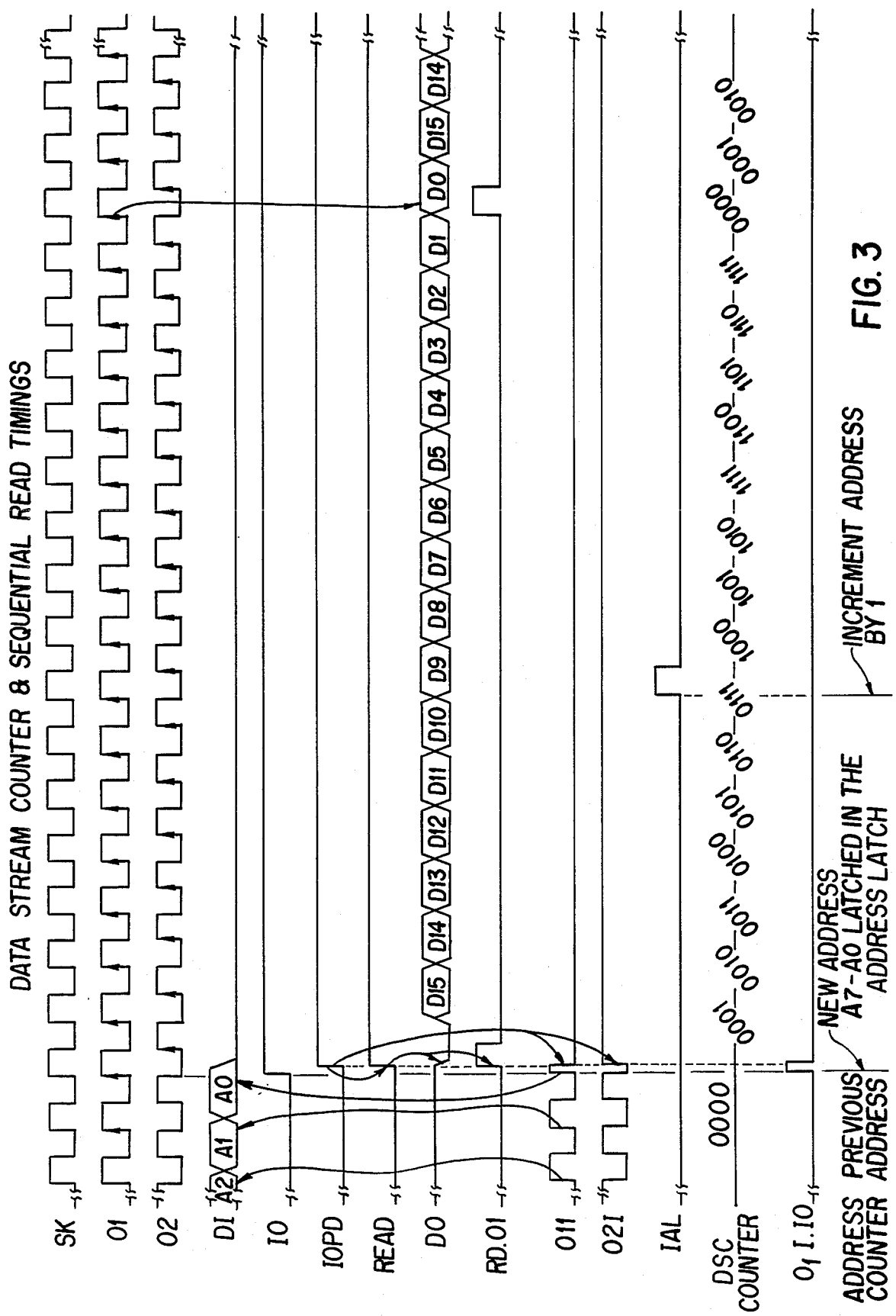

The mechanics of serial read access in accordance with the present invention will be described with reference to the timing diagram shown in FIG. 3 and the FIG. 2 schematic.

A read operation is accomplished by inputting a READ instruction into the instruction register 14 through the data-in pin 20. The READ instruction commences with a start bit "1" followed by the op-code and the address of the memory storage register to be read. During the clocking sequence, while the last address bit Ao is latched into the "Slave" at one end of the instruction register 14 on the rising edge of the $\phi$1 clock, the start bit is latched into the slave of the instruction register 14 at the other end making Io go high. In the illustrated embodiment, the Io signal is delayed to provide an IOPD signal which provides enough time for all bits in the instruction register 14 to stabilize. The IOPD signal going high forces the internal clock phases $\phi$1I and $\phi$2I clocking the instruction register 14 to stop clocking. This prevents any further data from being shifted into instruction register 14.

As further shown in FIG. 2, the bits of data stream counter 16 are initialized to zero when the READ signal is low by resetting the flip-flops which comprises the counter 16. With the IOPD signal going high, the READ instruction is decoded. The signal RD.$\phi$1 is true during the time READ and 01 are true and the data stream counter 16 count is zero. During the time interval RD.$\phi$1, the data from the register address in array 24 specified in the READ instruction resident in address register/counter 12 is latched into the data shift register 18 and the dummy zero bit is output on the data output pin 30 after a small delay through the data output driver. The dummy zero bit signals that a valid data stream is to follow. At the next clock pulse $\phi$2, the data bits are shifted one position to the right and at the following $\phi$1 clock phase, the new data bit (MSB of data, e.g. D15 in FIG. 3) is latched into the slave portion of the last shift register (the dummy bit). After some delay through the data output driver 28, the new data bit (e.g. D15) comes out on the data output pin 30. In this way, for every successive input clock phase, the next lower bit of data is output on the data output pin 30.

Because all the data bits (D15-DO in the illustrated example) corresponding to a memory address are latched into the data shift register 18 in parallel when RD.$\phi$1 is true, the address in the address register/counter 12 can be incremented while the data from the previous address is being serially clocked out on the data out pin 30.

In the illustrated embodiment, a count of 7 (decimal) has been selected to generate a signal IAL (increment address latch) to increment the address register/counter 12 count by 1. Following the decoding of the READ instruction, at the sixteenth clock phase $\phi$2, the data stream counter 16 rolls over to a count of 0 and during the sixteenth clock phase $\phi$1 following the READ decoding, the signal RD.$\phi$1 is true again. During the time interval when the RD.$\phi$1 signal is high, the data corresponding to the new incremented address is transferred into the masters and slaves of all sixteen data shift registers 18. Simultaneously, the LSB (DO) of the previous data stream is clocked out of the dummy bit 26 into the data output drivers 28 and onto the data output pad 30.

On the seventeenth high going phase of clock signal $\phi 2$ following the decoding of the READ instruction, the MSB (data bit D15*) of the incremented address is shifted into the master of the dummy bit and at the seventeenth high going phase of $\phi 1$, the data bit D15* is output on the data output pad 30.

This sequence of events repeats for each 16 bits of data. Thus, a continuous stream of data bits can be serially clocked out of the data output pad 3 without the need for providing the new addresses to the circuit 10 by inputting new READ instructions over and over again. This provides a substantial time savings. In this way, the entire memory array 24 can be read in one continuous data stream or as registers of length varying from 16 to 4096 bits. Thus, the array 24 can also be used as a shift register of variable lengths (from 16 to 256 bits).

It should be understood that various alternatives to the embodiment of the invention shown herein may be employed in practicing the invention. It is intended that the following claims define the invention and that circuits within the scope of these claims and their equivalents be covered thereby.

What is claimed is:

1. Apparatus for reading a sequential series of storage registers within a memory array wherein the memory array includes a plurality of storage registers organized for read access by having sequential binary addresses associated therewith, each storage register having capacity for storing data comprising a plurality of data bits, the apparatus comprising:
   (a) address register/counter means for storing a binary address which is used to access a preselected storage register within the memory array to serially read the data bits from the preselected storage register, the address register/counter means including means for incrementing the stored binary address by 1 upon receipt of an increment signal; and
   (b) means for determining that all of the plurality of data bits stored in the preselected storage register have been read from the preselected storage register and for generating the increment signal in response to said determination such that data is read from storage registers within the memory array having sequential binary addresses, whereby the apparatus automatically initiates a read of a sequence of storage registers in the array, the read sequence comprising a variable number of storage registers.

2. A method for reading a plurality of sequential data storage registers within a memory array, the method comprising the steps of:
   (a) accessing a preselected storage register within the array utilizing a binary address corresponding to the preselected storage register,
   (b) reading data from the preselected storage register;
   (c) sensing that data has been read from the preselected storage register;
   (d) upon sensing that data has been read from the preselected storage register, automatically incrementing by 1 the binary address utilized to access the preselected storage register; and
   (e) repeating steps (a)-(d) above utilizing the incremented binary addresses to read each of a plurality of sequential data storage registers within the memory array, thereby initiating the read of sequence of storage registers in the array, the read sequence comprising a variable number of storage registers.

3. A method as in claim 2 wherein the sequence of incremented binary addresses is returned to the first address in the sequence after the Nth data storage register has been read such that all N registers in the memory array are used.

4. Serial read access circuitry for reading sequential storage registers within a memory array of the type that includes a plurality of storage registers organized for read access by having sequential binary addresses associated therewith, each storage register having capacity for storing data comprising a plurality of data bits, the serial read access circuitry comprising:
   (a) an instruction shift register that serially receives a read instruction comprising a plurality of data bits, the read instruction including the binary address of a preselected storage register within the memory array, the instruction shift register including means responsive to receipt by the instruction shift register means of all of the plurality of data bits of the read instruction for generating a latch signal;
   (b) an address register/counter that stores the binary address of a storage register to be read, the address register/counter including means for incrementing by 1 the binary address stored therein in response to an increment signal, the address register/counter being responsive to the latch signal for receiving the binary address of the preselected storage register from the instruction shift register as the address stored therein;
   (c) a data shift register that receives the plurality of data bits stored in the preselected storage register and provides the received data bits as an output in serial form; and
   (d) a data stream counter that counts the number of data bits provided by the data shift register and generates the increment signal when all of the plurality of data bits have been transferred from the data shift register, whereby the binary address stored in the address register/counter is incremented by 1 such that the storage register in the memory array having the next sequential address is read, whereby the serial read access circuitry automatically initiates a read of a sequence of storage registers in the array, the read sequence comprising a variable number of storage registers.

* * * * *